US007271345B2

(12) United States Patent
Freeman et al.

(10) Patent No.: US 7,271,345 B2
(45) Date of Patent: Sep. 18, 2007

(54) METHOD AND APPARATUS FOR ATTENUATING FLEXIBLE CIRCUIT RESONANCE

(75) Inventors: Rick P. Freeman, Northfield, MN (US); Michael David Schroeder, Webster, MN (US); Daniel Dennis Dittmer, Plato, MN (US); Fei Wang, Savage, MN (US)

(73) Assignee: Seagate Technology LLC, Scotts Valley, CA (US)

(*) Notice: Subject to any disclaimer, the term of this patent is extended or adjusted under 35 U.S.C. 154(b) by 0 days.

(21) Appl. No.: 11/142,649

(22) Filed: Jun. 1, 2005

(65) Prior Publication Data

US 2006/0276058 A1 Dec. 7, 2006

(51) Int. Cl.
*H01B 7/08* (2006.01)

(52) U.S. Cl. .................................................. 174/117 F

(58) Field of Classification Search ............ 174/117 F, 174/117 FF; 360/264.2
See application file for complete search history.

(56) References Cited

U.S. PATENT DOCUMENTS

| | | | | |
|---|---|---|---|---|
| 4,967,296 | A | 10/1990 | Wiens et al. | 360/106 |
| 5,357,386 | A | 10/1994 | Haidari et al. | 360/97.02 |
| 5,375,021 | A | 12/1994 | Boeckner | 360/97.01 |
| 5,404,636 | A | 4/1995 | Stefansky et al. | 29/603 |
| 5,615,068 | A | 3/1997 | Matsuda et al. | 360/106 |
| 5,644,452 | A | 7/1997 | Cox et al. | 360/106 |
| 5,680,277 | A | 10/1997 | Bonn et al. | 360/106 |
| 5,717,541 | A | 2/1998 | Ycas et al. | 360/97.01 |
| 5,745,326 | A | 4/1998 | Koriyama | 360/106 |
| 5,818,667 | A | 10/1998 | Larson | 360/106 |
| 5,901,020 | A | 5/1999 | Koriyama | 360/106 |
| 5,907,452 | A | 5/1999 | Kan | 360/97.01 |
| 5,909,338 | A | 6/1999 | Butler et al. | 360/97.01 |
| 5,923,501 | A | 7/1999 | Suzuki et al. | 360/106 |
| 5,940,252 | A | 8/1999 | Patterson | 360/106 |
| 5,953,183 | A | 9/1999 | Butler et al. | 360/106 |
| 6,018,439 | A | 1/2000 | Forbord et al. | 360/104 |
| 6,129,579 | A | 10/2000 | Cox et al. | 439/493 |
| 6,166,888 | A | 12/2000 | Tsuda et al. | 360/264.2 |
| 6,168,459 | B1 | 1/2001 | Cox et al. | 439/495 |
| 6,236,531 | B1 | 5/2001 | Allsup et al. | 360/97.01 |
| 6,236,533 | B1 | 5/2001 | Forbord et al. | 360/98.01 |
| 6,270,375 | B1 | 8/2001 | Cox et al. | 439/493 |
| 6,721,135 | B2 | 4/2004 | Hong et al. | 360/264.2 |
| 6,791,799 | B2 | 9/2004 | Fletcher | 360/255 |
| 2003/0081353 | A1 | 5/2003 | Fletcher | 360/255 |
| 2003/0086214 | A1 | 5/2003 | Shin | 360/266.3 |
| 2003/0137776 | A1 | 7/2003 | Zhoa et al. | 360/264.2 |
| 2003/0214758 | A1 | 11/2003 | Lim et al. | 360/264.7 |
| 2004/0034724 | A1 | 2/2004 | Bruner et al. | 710/8 |
| 2004/0037007 | A1 | 2/2004 | Rugg et al. | 360/245.9 |

*Primary Examiner*—Chau N. Nguyen
(74) *Attorney, Agent, or Firm*—Leanne R. Taveggia; Westman, Champlin & Kelly, P.A.

(57) ABSTRACT

The present invention includes a method and apparatus for attenuating flexible circuit resonance. The apparatus includes a flexible circuit assembly. The flexible circuit assembly has a flexible circuit having a flexible cable with first and second sides. The flexible circuit assembly also includes a circuit support. The circuit support includes a base having top and bottom surfaces. The bottom surface is attached to the first side of the flexible cable. The circuit support also includes a support wall extending substantially perpendicularly relative to the top surface of the base. The support wall has a first face, which is substantially oriented towards the top surface of the base. The first side of the flexible cable is attached to the first face and also faces a second face of the support wall to thereby reverse a direction in which the flexible cable faces.

12 Claims, 7 Drawing Sheets

METHOD AND APPARATUS FOR ATTENUATING FLEXIBLE CIRCUIT RESONANCE

FIELD OF THE INVENTION

The present invention relates generally to flexible circuits. In particular, the present invention relates to a flexible circuit assembly for attenuating resonance.

BACKGROUND OF THE INVENTION

Disc drives are common data storage systems. A typical disc drive includes a rigid housing having a base deck that encloses a variety of disc drive components. The components include one or more discs having data surfaces that are coated with a medium for storage of digital information in a plurality of circular, concentric data tracks. The discs are mounted on a spindle motor that causes the discs to spin and the data surfaces of the discs to pass under aerodynamic bearing head sliders. The sliders, supported on suspension arms that move across the disc by an actuator mechanism, carry transducers, which write information to and read information from the data surfaces of the discs.

A flexible circuit assembly electrically connects the read/write elements on the disc head slider and the arm electronics on the actuator mechanism to a printed circuit board (PCB) that interfaces with a host computer. The flexible circuit assembly includes a flexible cable that allows pivotal movement of the actuator mechanism during operation. The flexible cable includes electrical traces supported by a polymeric carrier material.

Resonance in the flexible cable continues to be a common problem in data storage systems. When a data storage system is engaged in a data seeking process, the flexible cable moves together with the actuator mechanism at a connected end. As a result, the motion/vibration/resonance associated with the flexible cable can be large enough to cause functional failure for the system, e.g. the slider is unable to settle out above the commanded track as rapidly as required. As each new generation of data storage system demands more recorded tracks per inch, attenuating or reducing the flex resonance becomes more important. Recently many flexible circuit designs have incorporated dampers adhered to the flexible cable to absorb some of the energy associated with vibration in the flex cable. However, these dampers do not solve the problems related to variation in frequency of vibrations.

Embodiments of the present invention provide solutions to these and other problems, and offer other advantages over the prior art.

SUMMARY OF THE INVENTION

The present invention includes a flexible circuit assembly. The flexible circuit assembly includes a flexible circuit having a flexible cable with first and second sides. The flexible circuit assembly also includes a circuit support. The circuit support includes a base having top and bottom surfaces. The bottom surface is attached to the first side of the flexible cable. The circuit support also includes a support wall extending substantially perpendicularly relative to the top surface of the base. The support wall has a first face, which is substantially oriented towards the top surface of the base. The first side of the flexible cable is attached to the first face.

In another embodiment, the present invention includes a method of making a flexible circuit. The method includes providing a stiffener substrate. The method also includes stamping the stiffener substrate to form at least one set of stiffener plates. Each set of stiffener plates includes a first stiffener plate and a second stiffener plate. The first stiffener plate and the second stiffener plate are spaced from each other by a distance that corresponds with a service loop length of a flexible cable. The flexible cable is laminated to each set of stiffener plates with laminate to form the flexible circuit. After the flexible circuit is formed, the stiffener substrate is separated from the set of stiffener plates.

The present invention, as summarized, provides a flexible circuit assembly that reduces the frequency variation of the resonance modes in the service loop portion of the flexible cable. In addition, the present invention provides a cost efficient and primary process of making a flexible circuit. Other features and benefits that characterize embodiments of the present invention will be apparent upon reading the following detailed description and review of the associated drawings.

DETAILED DESCRIPTION OF ILLUSTRATIVE EMBODIMENTS

Figure 1:
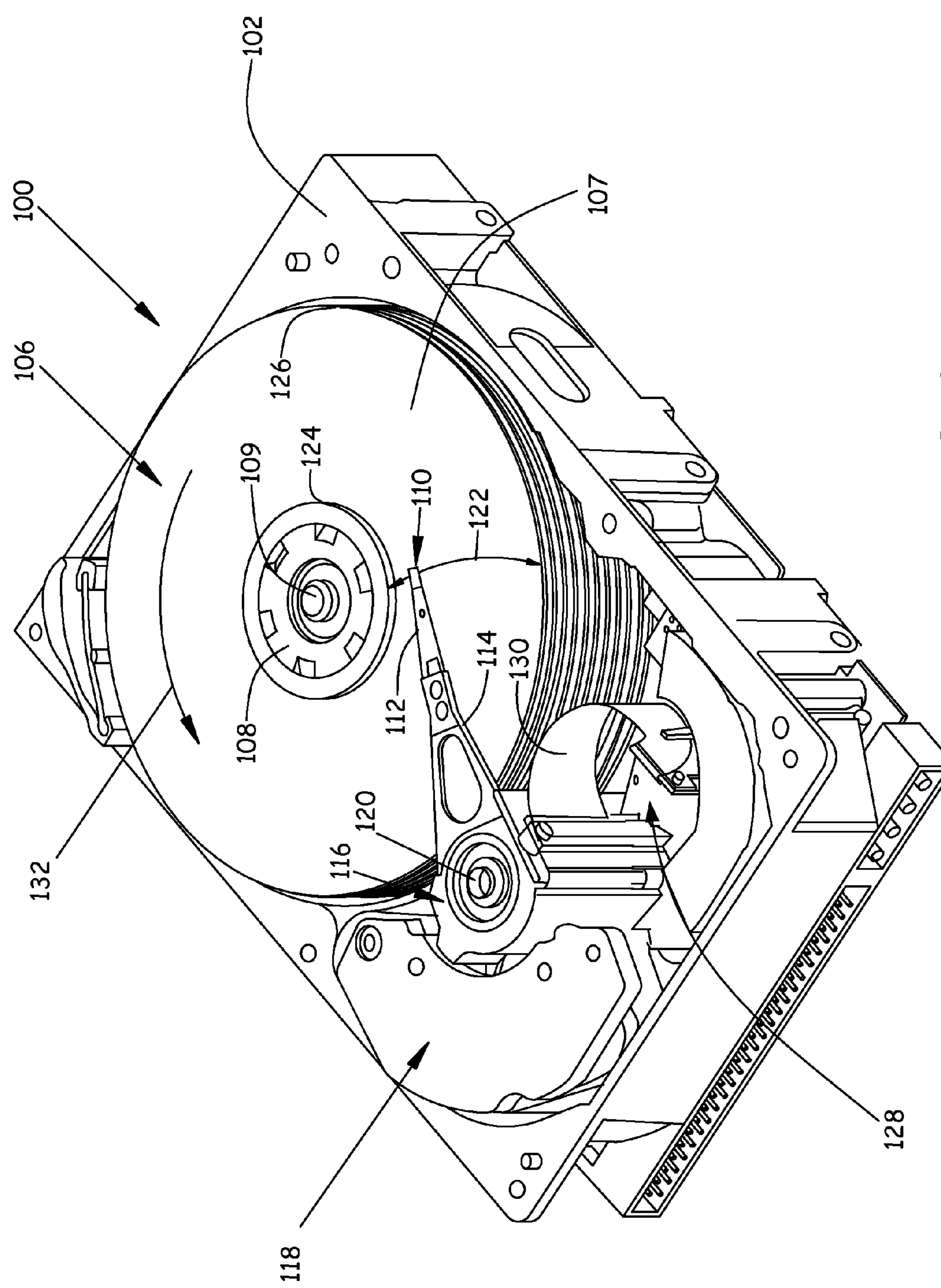
FIG. 1 is a perspective view of a data storage system in accordance with an embodiment of the present invention.

FIG. 1 is a perspective view of a data storage system or disc drive 100 in accordance with an embodiment of the present invention. Disc drive 100 includes a housing having a base 102 and a top cover (not shown). Disc drive 100 further includes a disc pack 106, which is mounted on a spindle motor (not shown) by a disc clamp 108. Disc pack 106 includes a plurality of individual discs 107, which are mounted for co-rotation about central axis 109. However, disc drive 100 can also include a single disc that is mounted to a spindle motor by disc clamp 108. Regardless of the quantity of discs, each disc surface has an associated disc head slider 110, which is mounted to disc drive 100 for communication with the disc surface. In FIG. 1, sliders 110 are supported by suspensions 112, which are in turn attached to track accessing arms 114 of an actuator mechanism 116. The actuator mechanism shown in FIG. 1 is of the type known as a rotary moving coil actuator and includes a voice coil motor (VCM), shown generally at 118. Voice coil motor 118 rotates actuator mechanism about pivot shaft 120 to position sliders 110 over a desired data track along an arcuate path 122 between a disc inner diameter 124 and a disc outer diameter 126. Voice coil motor 118 is driven by servo electronics, also known as a controller, based on signals generated by read/write heads.

A flexible circuit assembly 128, in accordance with an embodiment of the present invention, provides the requisite electrical connection to and from the read/write elements on the disc head slider and the arm electronics on the actuator mechanism 116. Flexible circuit assembly 128 includes a flexible cable 130, which provides electrical traces or electrical paths while allowing pivotal movement of actuator mechanism 116 during operation. Flexible cable 130 provides an electrical path from the read/write elements and actuator mechanism 116 to a connector for connection to a printed circuit board (PCB) and ultimately to a host computer. Flexible circuit assembly 128 is described in further detail below.

Figure 2:
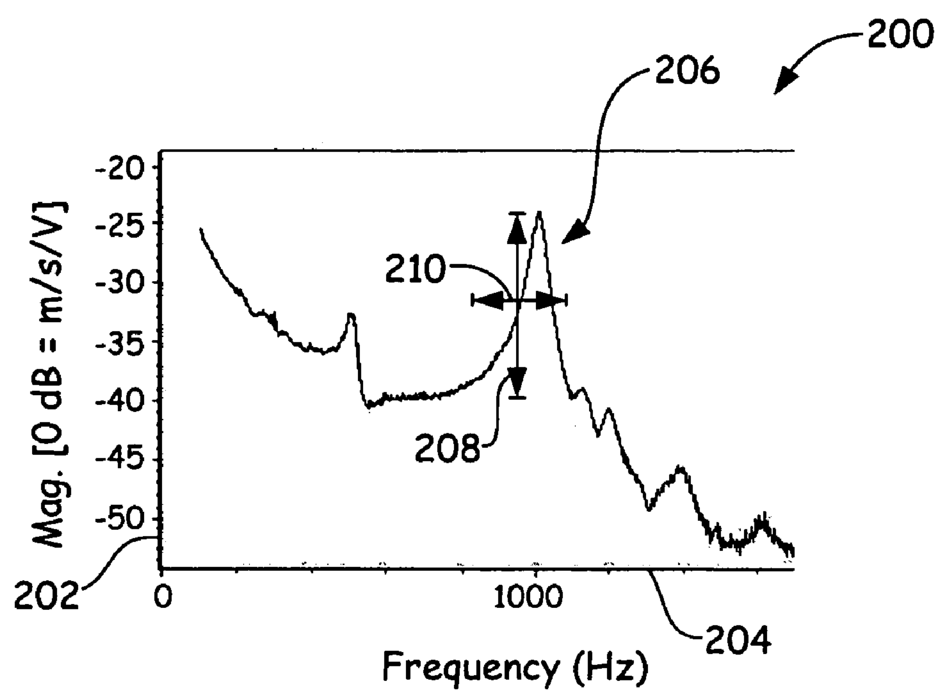
FIG. 2 illustrates a harmonic plot of a flexible circuit.

Resonance, in flexible cables, continues to be a common problem in data storage systems. When a data storage system is engaged in a data seeking process, the flexible cable moves together with the actuator mechanism at a connected end. The flexible cable stores the energy from the move and can feed energy back to the actuator and cause the sliders to become "off-track". This resonance is demonstrated on a plot 200 illustrated in FIG. 2. Plot 200 illustrates the harmonics of a rigid body, i.e., a flexible cable. Plot 200 includes a y-axis 202 that represents the magnitude of the gain in decibels (dB) and a x-axis 204 that represents the frequency in hertz (hz). A resonance mode is illustrated at 206. Resonance mode 206 includes both a variation in gain 208 and a variation in frequency 210. A damper that is adhered to a flexible cable dampens the variation in gain. However, the damper does not reduce the variation in frequency.

Figure 3:
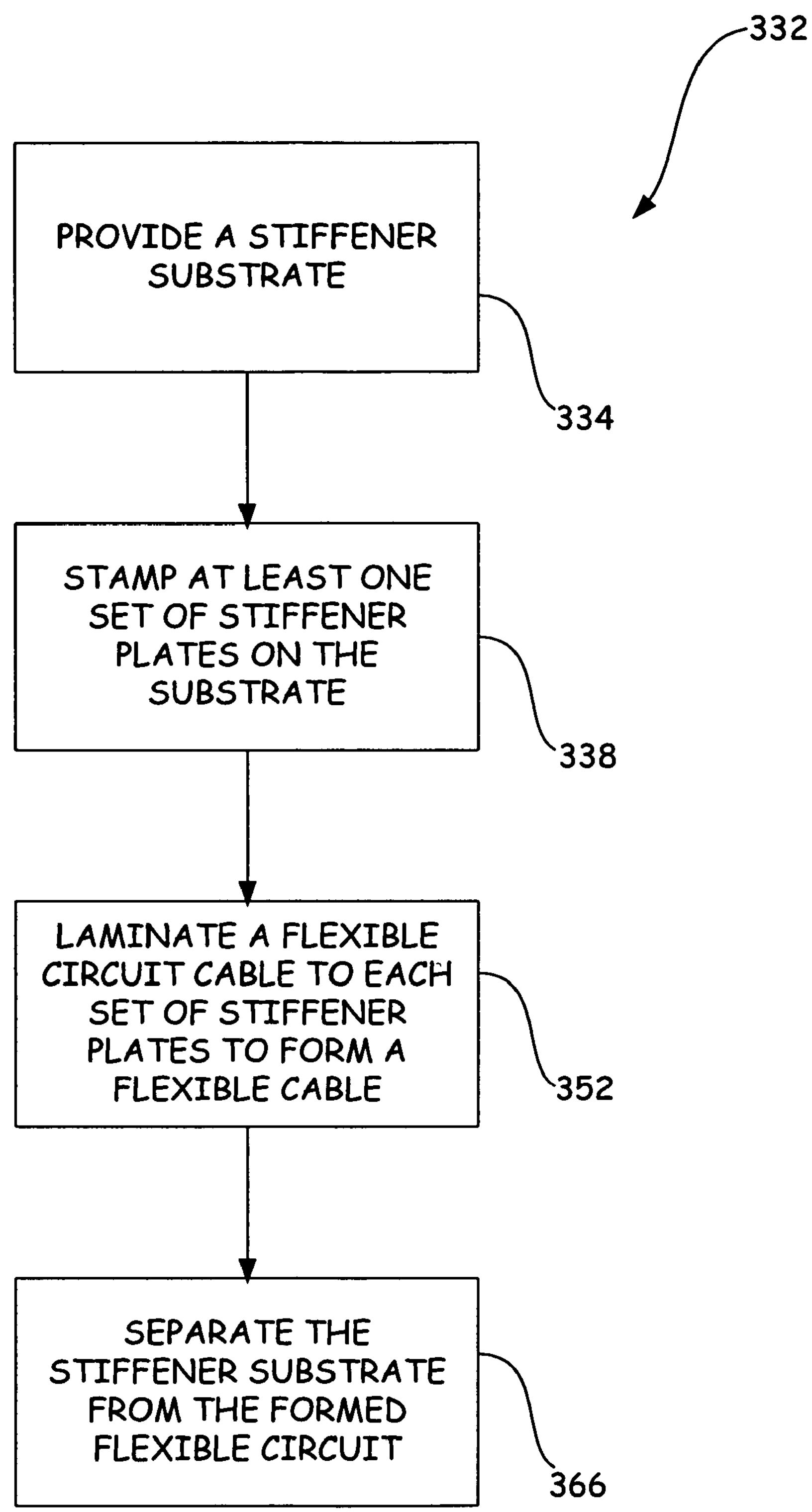
FIG. 3 is a flowchart illustrating a method of making flexible circuits that reduces a variation in frequency in accordance with an embodiment of the present invention.
Figure 4:
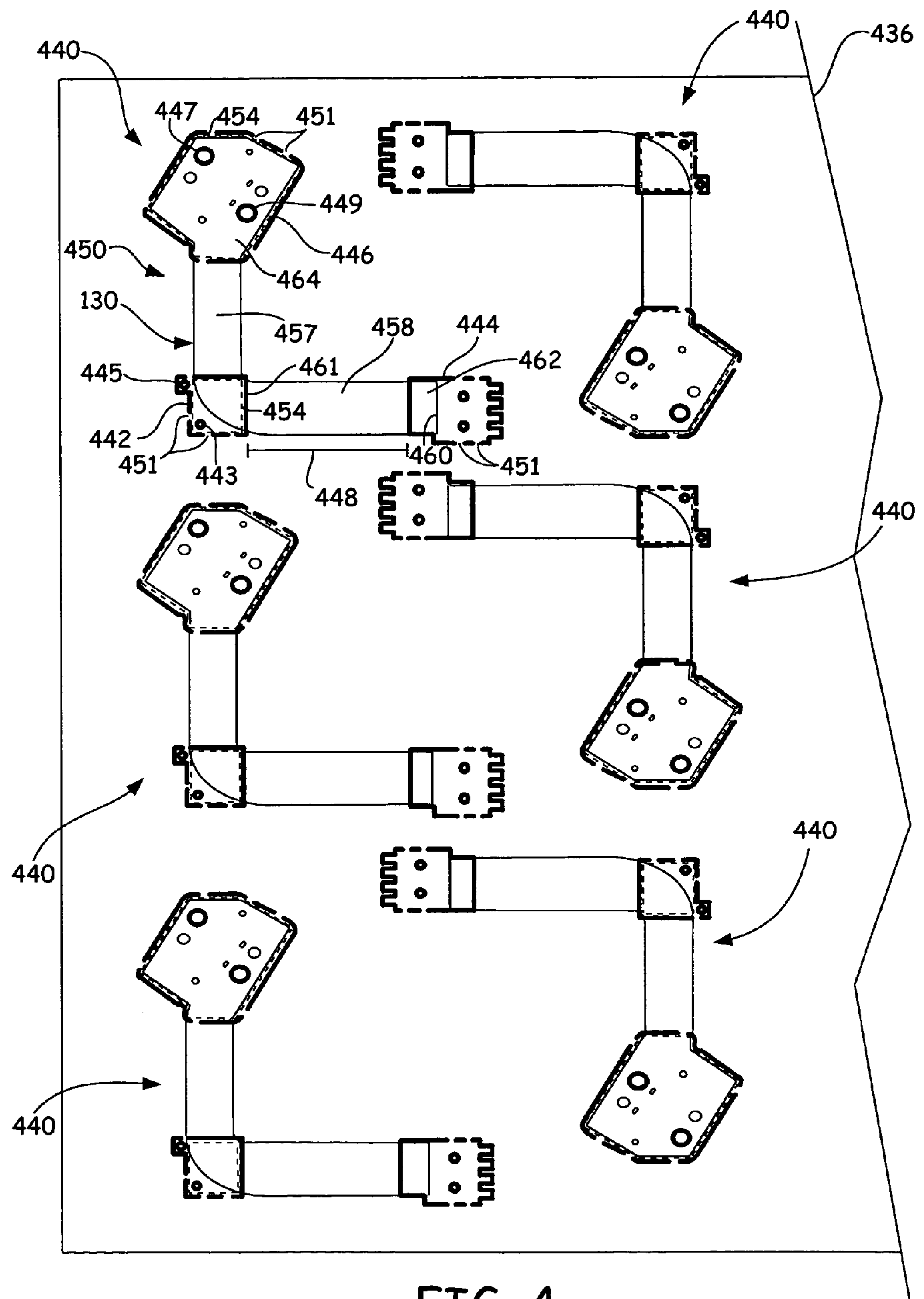
FIG. 4 is a top plan view of a stiffener substrate illustrating a plurality of flexible circuits formed in accordance with the steps illustrated in FIG. 3.

FIG. 3 is a flowchart 332 illustrating a method of making at least one flexible circuit in accordance with an embodiment of the present invention. The flexible circuit that is formed by following the steps illustrated in flowchart 332 will attenuate variation in frequency of the resonance in a flexible cable. FIG. 4 is a top plan view of a stiffener substrate 436 illustrating a plurality of flexible circuits formed in accordance with the steps illustrated in FIG. 3. Forming flexible circuits on substrate 436 in accordance with the method illustrated in FIG. 3 ensures accurate and efficient assembly. In addition, flexible circuits can be formed in a single process instead of multiple processes.

At block 334 of FIG. 3, a stiffener substrate 436 is provided. Stiffener substrate 436, in accordance with an embodiment of the present invention, comprises aluminum. However, those skilled in the art should recognize that stiffener substrate 436 can be made from other types of metallic or non-metallic material. For example, stiffener substrate 436 can be made of steel, brass, glass, ceramic, epoxy, epoxy glass, polyimide and other material or composite materials that are sufficiently rigid to resist dynamic loop resonances. These materials are not an exhaustive list.

At block 338, stiffener substrate 436 is stamped to form at least one set of stiffener plates 440. As illustrated in FIG. 4, each set of stiffener plates 440 includes a first stiffener plate 442, a second stiffener plate 444, and a third stiffener plate 446. First stiffener plate 442 is spaced apart from second stiffener plate 444 by a distance that corresponds to a service loop length 448. Service loop length 448 corresponds to the length of a service loop portion 458 of flexible cable 130. Service loop portion 458 is the portion of flexible cable 130 that moves with an actuator mechanism during the data seeking process in a data storage system. Service loop length 448 generally defines the nature of vibration frequency in flexible cable 130.

Figure 5:
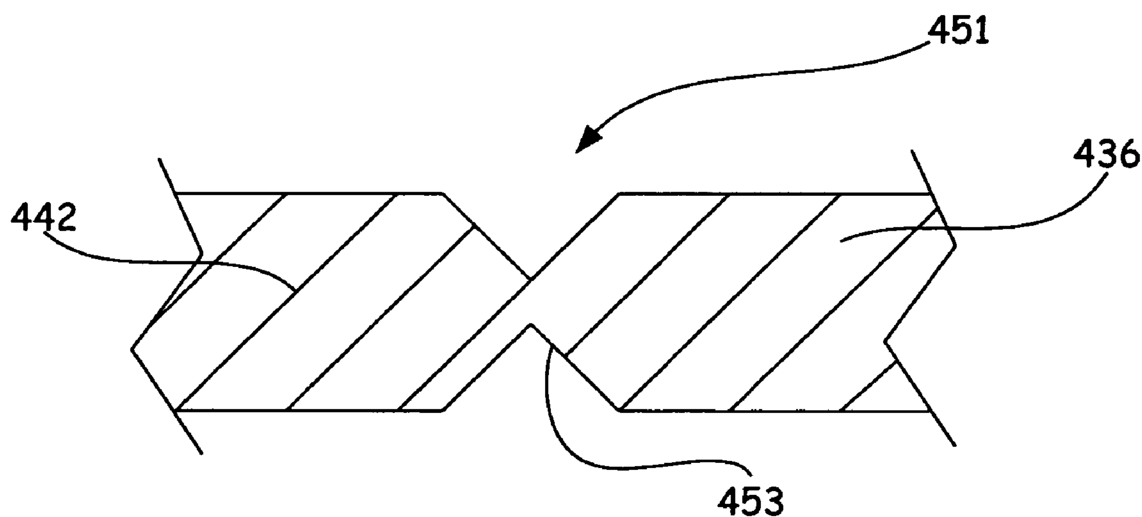
FIG. 5 illustrates a sectional view of a bridge as illustrated in FIG. 4 in accordance with an embodiment of the present invention.

First stiffener plate 442 includes a first aperture 443 and a second aperture 445. First aperture 443 and second aperture 445 are configured for use in a later attachment to a support structure, which will be described in greater detail below. During the stamping of stiffener substrate 436, each set of stiffener plates 440 is not fully separated from the remaining stiffener substrate. Each stiffener plate 442, 444 and 446 remains attached to stiffener substrate 436 by a plurality of bridges 451. In accordance with the present invention, each bridge 451, as illustrated sectionally in FIG. 5, includes a v-groove 453. In FIG. 5, the remaining portion of stiffener substrate 436 is separated from a stiffener plate, such as stiffener plate 442, by v-groove 453 of bridge 451. V-groove 453 provides that each stiffener plate remain in connection with stiffener substrate 436. Therefore, each stiffener plate maintains a consistent relative relation with the other stiffener plates.

At block 352, flexible cable 130 (illustrated as a solid line) is laminated to the set of stiffener plates 440 with a laminate 454 (illustrated as dashed lines) to form a flexible circuit 450. Flexible cable 130 includes a first side (not shown) and a second side 457. Flexible cable 130 also includes service loop portion 458 having a first end 460 and a second end 461. As illustrated in FIG. 4, first end 460 of service loop portion 458 coincides with a first end 462 of flexible cable 130. The first end 460 of service loop portion 458 is laminated to second stiffener plate 444 and the second end 461 of the service portion is laminated to first stiffener plate 442. A second end 464 of flexible cable 130 is laminated to third stiffener plate 446. Third stiffener plate also includes a first aperture 447 and a second aperture 449. First aperture 447 and second aperture 449 are configured for use in a later attachment to a support structure, which will be described in greater detail below. An electrical connector 490 (illustrated in FIG. 8) is also attached to third stiffener plate 446 through flexible cable 130. The electrical connector is configured for use in attaching the electrical traces provided by flexible cable 130 to a PCB.

At block 366, stiffener substrate 436 is separated from each stiffener plate at each v-groove 453 (FIG. 5). For example, the entire substrate 436 can be placed in an engineering tool. The tool removes each flexible circuit 450 by breaking each v-groove 453.

Figure 6:
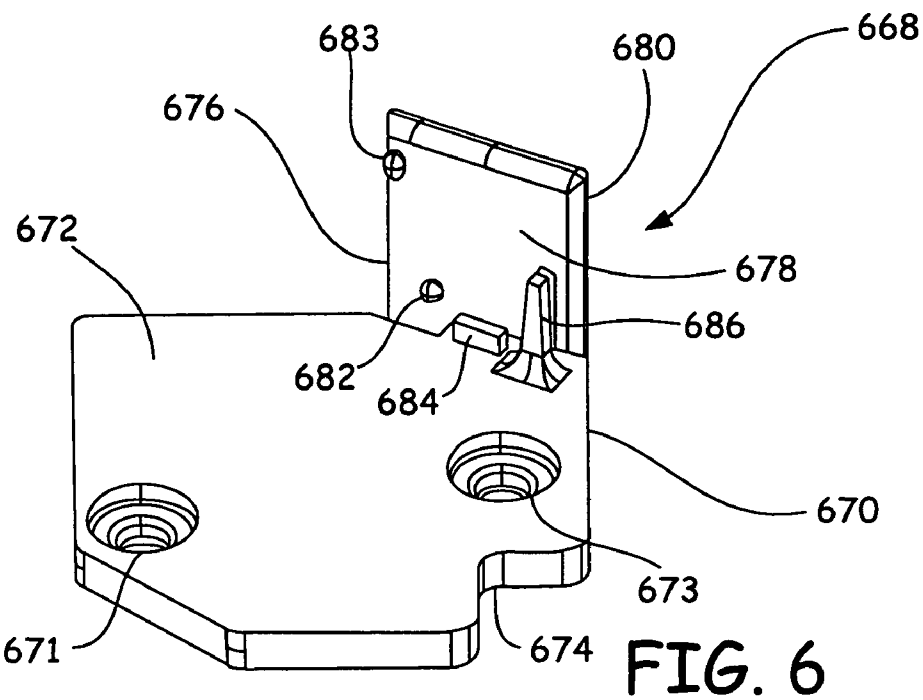
FIG. 6 illustrates a perspective view of a circuit support in accordance with an embodiment of the present invention.
Figure 7:
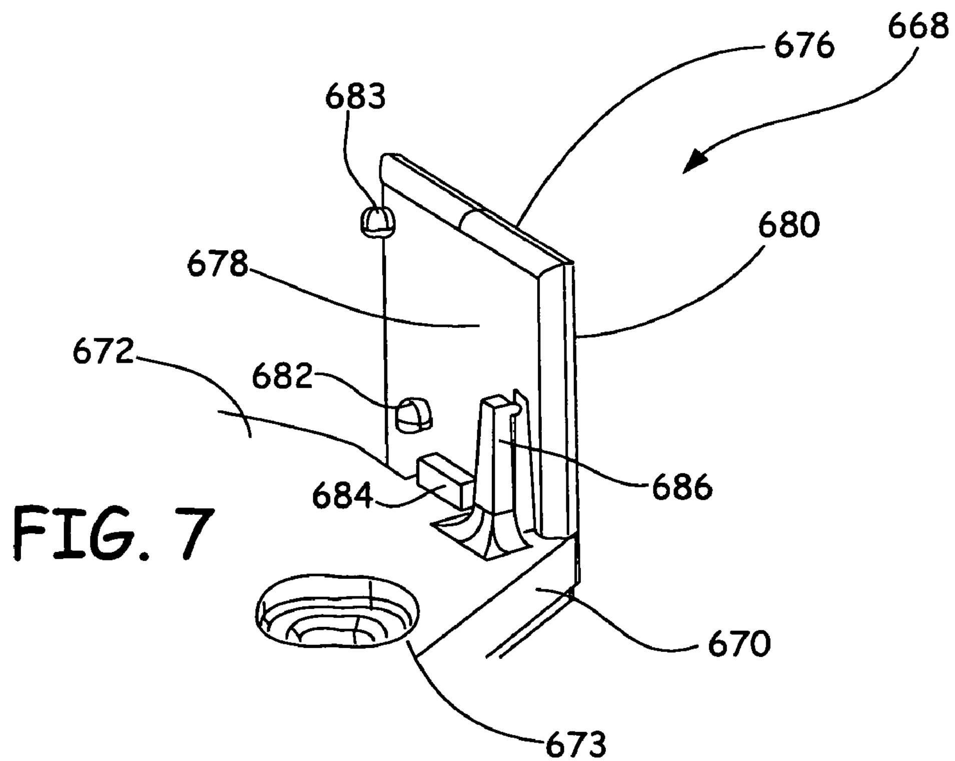
FIG. 7 illustrates an enlarged view of a circuit support as illustrated in FIG. 6 in accordance with an embodiment of the present invention.
Figure 8:
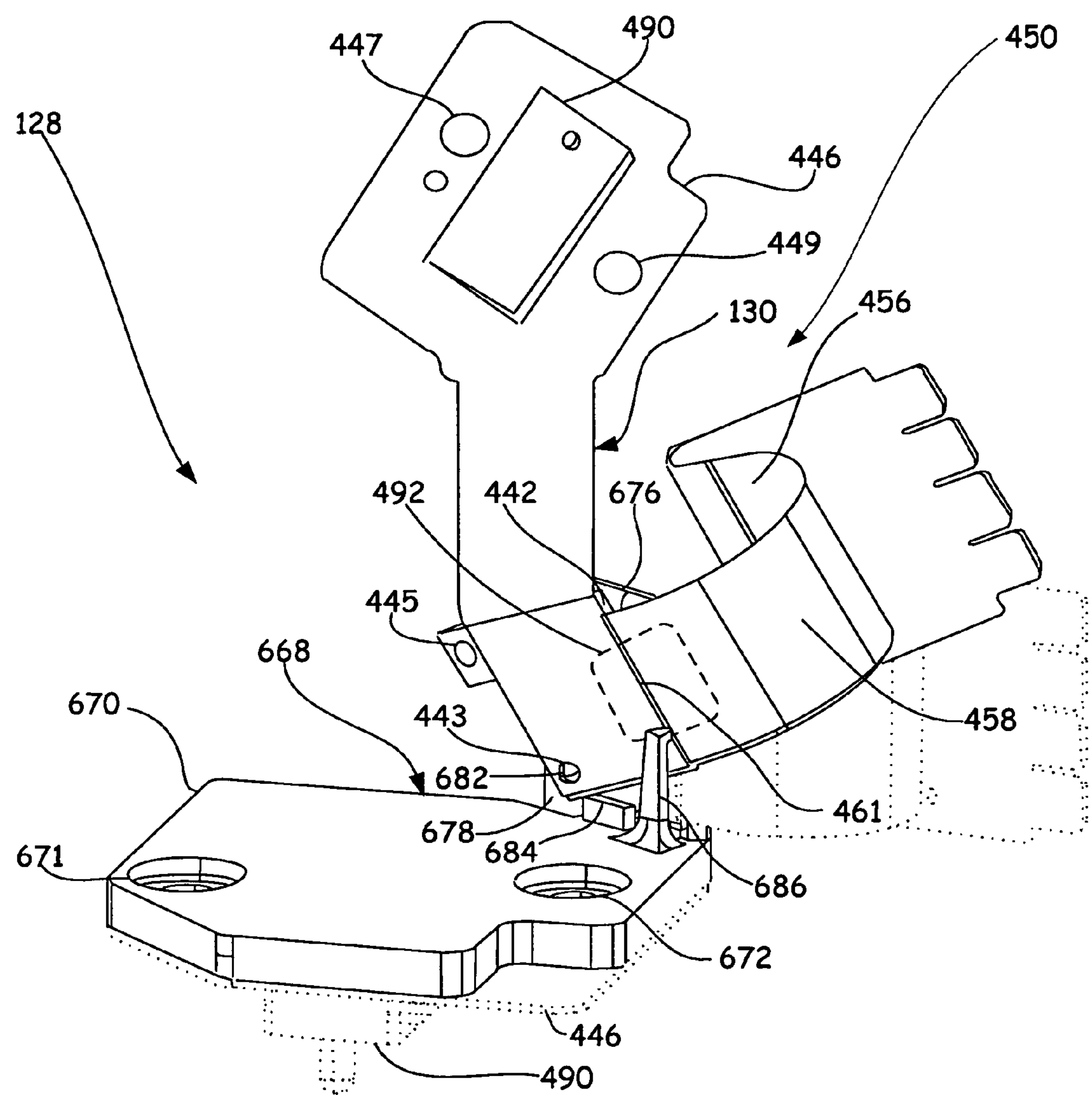
FIG. 8 illustrates a perspective view of constructing a flexible circuit assembly in accordance with an embodiment of the present invention.
Figure 9:
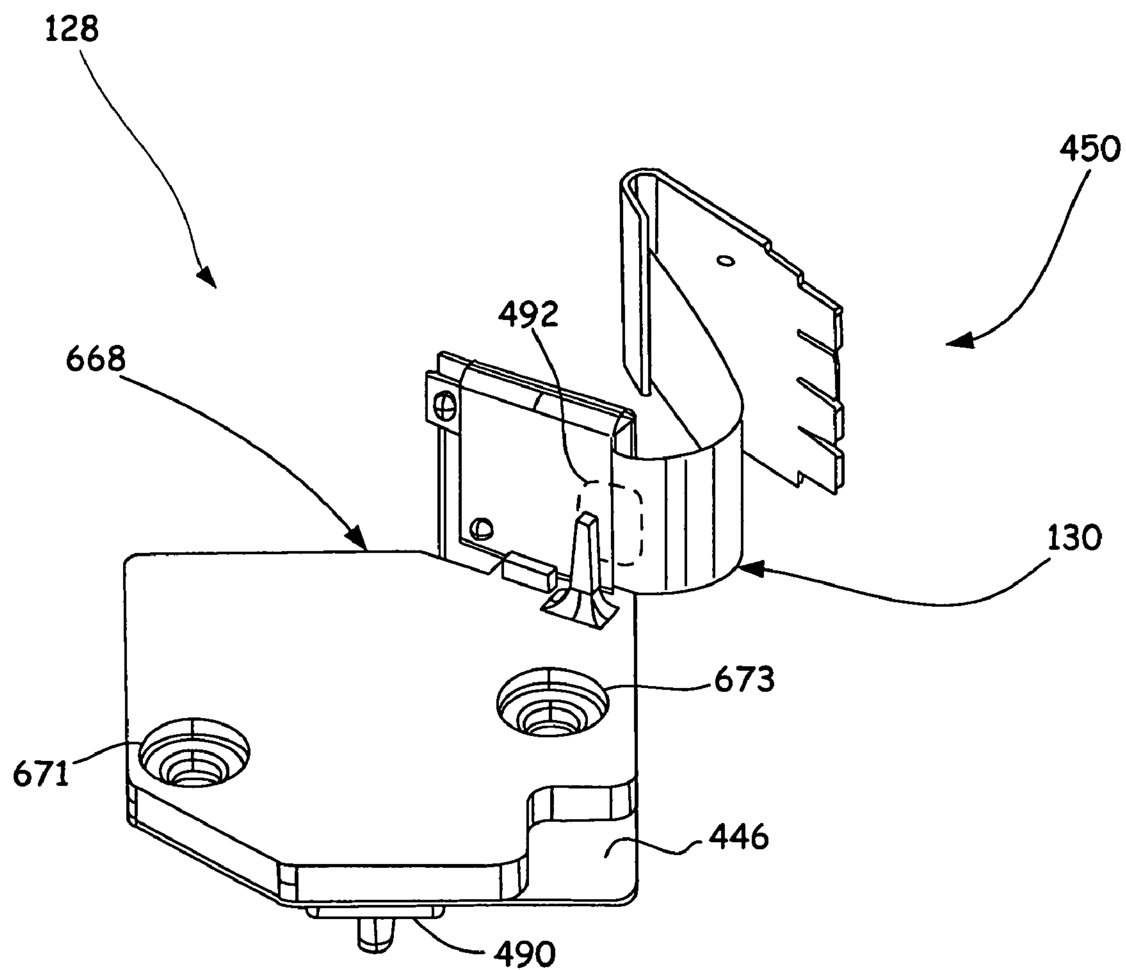
FIG. 9 illustrates a perspective view of a flexible circuit assembly as constructed in FIG. 8 in accordance with an embodiment of the present invention.

In accordance with another embodiment, the present invention also includes flexible circuit assembly 128 (FIG. 1) that includes a flexible circuit as formed in accordance with FIGS. 3-5. The flexible circuit assembly (as illustrated in FIGS. 1, 8 and 9) includes a circuit support or flex clamp 668. Circuit support 668 is perspectively illustrated in FIG. 6 and partially illustrated in FIG. 7. Circuit support 668 includes a base 670 and a support wall 676. Both base 670 and support wall 676 are integrally formed to comprise a single type of material. For example, circuit support 668 can be molded from plastic. However, it should be noted that other types of materials can be used to form circuit support 668. Base 670 includes a top surface 672 and an opposing bottom surface 674 as well as a first aperture 671 and a second aperture 673. First and second apertures 671 and 673 extend from top surface 672 through base 670 to bottom surface 674. Support wall 676 extends substantially perpendicular in relation to top surface 672 of base 670. Support wall 676 includes a first face 678 and an opposing second face 680. First face 678 is substantially oriented towards top surface 672. Circuit support 668 also includes a plurality of integral features for guiding, securing and holding a flexible circuit, such as flexible circuit 450 illustrated in FIG. 4, in place. These features include a first pin 682, second pin 683, guide 684 and clip 686. First pin 682 and second pin 683 protrude from first face 678 of support wall 676. Guide 684 is formed on top surface 672 of base 670 and spaced apart from first face 678. Clip 686 is formed on top surface 672 of base 670 and is positioned adjacent to first face 678. Clip 686 is spring loaded and is biased towards applying a force to first face 678 of support wall 676.

FIG. 8 illustrates construction of a flexible circuit assembly 128 in accordance with an embodiment of the present invention. In FIG. 8, flexible circuit assembly 128 is formed by attaching flexible circuit 450 to circuit support 668. Flexible circuit 450 is described and illustrated in detail with respect to FIGS. 3-5. Circuit support 668 is described and illustrated in detail with respect to FIGS. 6 and 7. In accordance with FIG. 8, first stiffener plate 442 of flexible circuit 450 is attached to first face 678 of support wall 676 by placing first pin 682 through first aperture 443 in the first stiffener plate. Flexible circuit 450 is rotated clockwise such that first stiffener plate 442 is aligned with first face 678. In addition, a second pin (not shown) is placed through second aperture 445 of first stiffener plate 442. When flexible circuit 450 is rotated into place, first stiffener plate 442 is positioned behind guide 684 and first face 678 and between clip 686 and first face 678. Both guide 684 and clip 686 secure first stiffener plate 442 to support wall 676. Referring to the dashed lines in FIG. 8 and the perspective view illustrated in FIG. 9, after first stiffener plate 442 is secured into position, third stiffener plate 446 is wrapped about support wall 676 such that a first side 456 of flexible cable 130 faces a second face (not shown) of the support wall. Therefore, support wall 676 is configured to reverse a direction in which the first side 456 of flexible cable 130 faces. After reversing the direction which first side 456 faces, flexible cable 130 is attached by an adhesive to bottom surface (not shown in FIGS. 8 or 9) of base 670 through third stiffener plate 446. A first aperture 447 and second aperture 449 of third stiffener plate 446 are configured to align with first aperture 671 and second aperture 673 of base 670, respectively. Connector 490 is thereby in position to electrically couple to a PCB.

In another embodiment of the present invention, flexible circuit 450 can include a damper 492 to thereby minimize the variation in gain in resonance of flexible cable 130. Damper 492 is illustrated in dashed lines and is adhered to flexible circuit 450 on service loop portion 458 and on the portion of flexible cable 130 that is laminated to first stiffener 442. It should be noted, however, that damper 492 can be optionally added and adhered to different locations of flexible circuit 450.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the data storage system while maintaining substantially the same functionality without departing from the scope and spirit of the present invention. In addition, although the preferred embodiment described herein is directed to a data storage system for, it will be appreciated by those skilled in the art that the teachings of the present invention can be applied to other system that use flexible circuits, without departing from the scope and spirit of the present invention.

What is claimed is:

1. A flexible circuit assembly comprising:

a flexible circuit including a flexible cable having first and second sides and first and second ends, the flexible circuit including a service loop portion having a first end that coincides with the first end of the flexible cable and having a second end;

a circuit support comprising:

a base having top and bottom surfaces, wherein the bottom surface is attached to the first side of the flexible cable at the second end of the flexible cable;

a support wall extending substantially perpendicularly relative to the top surface of the base and having a first face which is substantially oriented towards the top surface of the base, wherein the first side of the flexible cable is attached to the first face; and wherein the flexible cable includes a first stiffener plate laminated to the first side of the flexible cable at the second end of the service loop portion, the flexible cable configured to attach to the first face of the support wall through the first stiffener plate.

2. The flexible circuit assembly of claim 1, wherein the flexible circuit comprises a second stiffener plate laminated to the first side of the flexible cable and at the first end of the service loop portion.

3. The flexible circuit assembly of claim 2, wherein the flexible circuit comprises a third stiffener plate laminated to the first side of the flexible cable, the third stiffener plate configured to attach to the bottom surface of the base.

4. The flexible circuit assembly of claim 2, wherein the flexible circuit comprises a connector configured to attach to the base though the third stiffener and the flexible cable.

5. The flexible circuit assembly of claim 2, wherein the first side of the flexible circuit is attached to the bottom surface of the base through a third stiffener plate.

6. The flexible circuit assembly of claim 1, wherein the support wall comprises a second face, the first side of the flexible cable facing the second face of the support wall such that the support wall reverses a direction in which the first side of the flexible cable faces.

7. The flexible circuit assembly of claim 1, wherein the circuit support further comprises at least one pin integrally formed and protruding from the first face of the support wall, the at least one pin integrally configured to retain the flexible circuit in place.

8. The flexible circuit assembly of claim 1, wherein the circuit support further comprises a clip integrally formed with the top surface of the base and located adjacent to the first face of the support wall, the clip configured to retain the flexible cable in place.

9. The flexible circuit assembly of claim 1, wherein the circuit support further comprises a guide integrally formed with the top surface of the base and spaced apart from the first face of the support wall, the guide configured to guide the flexible cable into place.

10. A flexible circuit assembly comprising:

a flexible circuit comprising:

a flexible cable having first and second sides, a first end coupleable to an actuator, a second end and a service loop portion having a first end that coincides with the first end of the flexible cable and a second end;

a first stiffener plate laminated to the first side of the flexible cable and at the second end of the service loop portion of the flexible cable;

a circuit support comprising:

a base having top and bottom surfaces, wherein the bottom surface is attached to the first side of the flexible cable at the second end of the flexible cable; and a support wall extending substantially perpendicularly relative to the top surface of the base and having a first face which is substantially oriented towards the top surface of the base, wherein the first side of the flexible cable and the first stiffener plate are attached to the first face.

11. The flexible circuit assembly of claim 10, wherein the flexible circuit comprises a second stiffener plate laminated to the first side of the flexible cable and at the first end of the service loop portion.

12. The flexible circuit assembly of claim 11, wherein the flexible circuit comprises a third stiffener plate laminated to the first side of the flexible cable, the third stiffener plate configured to attach to the bottom surface of the base.

* * * * *